US009746863B2

(12) United States Patent
Galy et al.

(10) Patent No.: US 9,746,863 B2
(45) Date of Patent: Aug. 29, 2017

(54) ELECTRONIC DEVICE FOR HEATING AN INTEGRATED STRUCTURE, FOR EXAMPLE AN MOS TRANSISTOR

(71) Applicant: STMicroelectronics SA, Montrouge (FR)

(72) Inventors: Philippe Galy, La Touvet (FR); Sotirios Athanasiou, Grenoble (FR); Julien Le Coz, Grenoble (FR); Sylvain Engels, Meylan (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 14/960,052

(22) Filed: Dec. 4, 2015

(65) Prior Publication Data
US 2016/0370815 A1 Dec. 22, 2016

(30) Foreign Application Priority Data

Jun. 16, 2015 (FR) ...................... 15 55459

(51) Int. Cl.
*H01L 23/34* (2006.01)
*G05F 1/46* (2006.01)
*H01L 27/02* (2006.01)
*H01L 27/06* (2006.01)

(52) U.S. Cl.
CPC ............ *G05F 1/463* (2013.01); *H01L 23/345* (2013.01); *H01L 27/0251* (2013.01); *H01L 27/0629* (2013.01); *H01L 2924/0002* (2013.01)

(58) Field of Classification Search
CPC .................................................. H01L 23/345
See application file for complete search history.

(56) References Cited

U.S. PATENT DOCUMENTS

| 4,356,379 | A | 10/1982 | Graeme | |
|---|---|---|---|---|
| 6,329,690 | B1 * | 12/2001 | Morrett | H01L 23/34 257/347 |
| 6,882,571 | B1 * | 4/2005 | Look | G11C 16/0408 257/E21.422 |
| 7,890,893 | B2 * | 2/2011 | Bolam | H01L 23/345 716/102 |
| 8,159,814 | B2 * | 4/2012 | Wang | H01L 23/345 257/E21.591 |
| 8,927,909 | B2 * | 1/2015 | Le Neel | H05B 1/0227 219/494 |

(Continued)

FOREIGN PATENT DOCUMENTS

WO    WO-0211147 A2    2/2002

OTHER PUBLICATIONS

INPI Search Report and Written Opinion for FR 1555459 dated Apr. 13, 2016 (7 pages).

*Primary Examiner* — Thomas J Hiltunen
(74) *Attorney, Agent, or Firm* — Gardere Wynne Sewell LLP

(57) ABSTRACT

An electronic device includes an integrated circuit with a MOS transistor and a heating circuit electrically coupled to at least two points of one of the source or drain semiconductive region of the transistor. A portion of the source or drain semiconductive region between the two points forms a resistive element. The heating circuit is configured to cause a current to circulate through the resistive element between the two points to heat an active region of the transistor.

23 Claims, 5 Drawing Sheets

(56) References Cited

U.S. PATENT DOCUMENTS

| | | | | |
|---|---|---|---|---|
| 8,952,499 B2* | 2/2015 | Morimoto | ............ | H01L 23/345 |
| | | | | 257/621 |
| 9,000,507 B2* | 4/2015 | Smith | ............... | H01L 21/28176 |
| | | | | 257/314 |
| 9,276,012 B2* | 3/2016 | Marshall | ................ | H01C 17/26 |
| 2009/0295457 A1 | 12/2009 | Mowry et al. | | |
| 2014/0183177 A1* | 7/2014 | Ota | ....................... | H01L 29/872 |
| | | | | 219/209 |

* cited by examiner

ELECTRONIC DEVICE FOR HEATING AN INTEGRATED STRUCTURE, FOR EXAMPLE AN MOS TRANSISTOR

PRIORITY CLAIM

This application claims priority from French Application for Patent No. 1555459 filed Jun. 16, 2015, the disclosure of which is incorporated by reference.

TECHNICAL FIELD

Embodiments of the invention relate to integrated circuits, and notably the heating of an active zone of one or more integrated structures, in particular one or more transistors, for example metal oxide semiconductor (MOS) transistors.

BACKGROUND

In certain applications, it may be particularly advantageous to heat the active zone of an MOS transistor, in particular when the MOS transistor is situated in a cold environment or else to improve performance levels of the MOS transistor in very low voltage applications.

Currently, complicated heating systems are used to increase the ambient temperature of the MOS transistor, in particular when the MOS transistor is situated in a cold environment.

SUMMARY

According to one embodiment, there is proposed an electronic device of simple architecture, that makes it possible to easily heat an integrated structure, for example an MOS transistor, without modifying the active zone or zones of the structure, for example the active zone of the transistor, or the functionality of the integrated circuit which incorporates this structure.

According to one aspect, an electronic device is proposed, comprising an integrated circuit comprising at least one integrated structure, for example an MOS transistor, and heating means electrically coupled to at least two points of an active zone of said at least one structure, for example to at least two points of one of the source or drain semiconductor regions of said at least one transistor, and configured to cause at least one current to circulate between said points.

In other words, according to this aspect, the active zone of said structure, for example the source region or the drain region of the MOS transistor, is used as heater by causing a current to circulate therein, for example by the application of a potential difference between said two points.

The circulation of this current will, by Joule's effect, increase the temperature of the active zone between said points and this heat will then be propagated in the active zone.

When the integrated structure is an MOS transistor, the circulation of this current will, by Joule's effect, increase the temperature of the source or drain region and this heat will then be propagated via the channel of the transistor to all of the active zone of this transistor.

Thus, the source region or the drain region itself becomes a heating device.

So as to have a greater efficiency, it is preferable for said points to be situated on a straight line extending substantially in the direction of the width of the channel of said at least one transistor.

When the number of said points is equal to two, it is preferable for the two points to be respectively situated in the vicinity of two ends of the active zone, for example the source or drain region.

So as to limit the risk of occurrence of the electromigration phenomenon, it is possible to cause a current to circulate in one direction and a current to circulate in the other direction between the two points in succession.

This limitation of the risk of occurrence of the electromigration phenomenon can also be obtained by providing a number of points equal to three, with a first point bracketed by two second points; the heating means are then configured to cause two currents to circulate between, respectively, the first point and the two second points.

In this respect, it is preferable for the two second points to be respectively situated in the vicinity of two ends of the active zone, for example the source or drain region, and for the first point to be situated substantially equidistantly from the two second points.

According to one embodiment, the heating means comprise electrically conductive contacts, for example of the type of those linking the active zones of a component to the first metallization level of the integrated circuit, respectively electrically coupled to said points and at least one current source configured to inject at least one current at one of said points via the corresponding contact, the resulting current or currents being discharged at another point or at the other points via the corresponding electrically conductive contact or contacts.

Equivalently, it is possible to use, in place of a current source, a voltage generator suitable for applying a potential difference between said points.

Although it is possible to inject a current in the source region or in the drain region of the MOS transistor, it is preferable to inject the current in the source region because the latter is already usually intended to be linked to the ground in the integrated circuit.

Thus, the contact or the contacts via which each of the currents is discharged is or are linked advantageously to a ground line of the integrated circuit.

It has been observed that it was more effective to heat the integrated structure, for example the MOS transistor, by using current pulses rather than a current circulating continually.

Thus, according to one embodiment, the heating means are configured to cause said at least one current to circulate in the form of at least one current pulse.

It is possible to heat the structure when the latter is operating at the risk of obtaining degraded, but possibly acceptable operation.

Thus, when the structure is an MOS transistor, this leads to the application of a potential difference between two different points of the source or of the drain of the transistor, when can then lead to a degraded operation of the transistor but an operation which may however be acceptable in certain applications.

That said, it is preferable, in other applications, for the heating means to be controllable and for the device to further comprise control means suitable for activating the heating means when the structure is not operating.

In other words, according to this embodiment, the structure, for example the transistor, is first of all "heated up", then, after having deactivated the heating means and preferably allowed a certain time interval to pass so as to obtain a uniformity of temperature in the active zone of the structure, it is possible to power the structure, for example the transistor, so as to place it in its normal operating mode.

According to one embodiment, the heating means can be configured to cause at least one current to circulate in a plurality of structures, for example transistors, of the integrated circuit via metallic lines extending over the structures. These metallic lines can then also contribute to the heating up of these structures.

The heating means can be distinct from the integrated circuit or else belong to the integrated circuit.

BRIEF DESCRIPTION OF THE DRAWINGS

Other advantages and features of the invention will become apparent on studying the detailed description of non-limiting embodiments, and the attached drawings in which.

DETAILED DESCRIPTION

Figure 1:
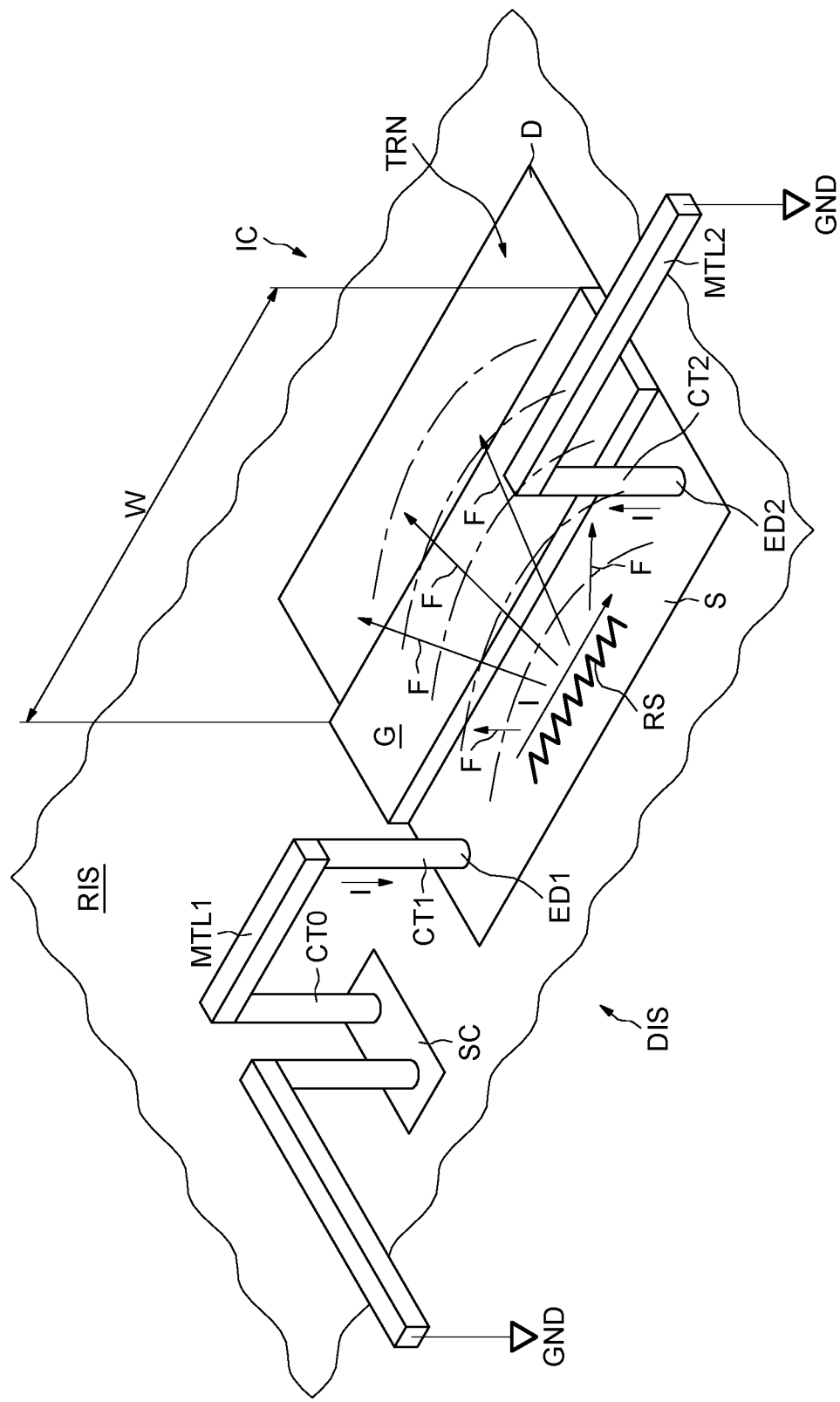
FIGS. 1 to 6 illustrate different embodiments.

In FIG. 1, the reference DIS denotes an electronic device fully integrated in an integrated circuit IC.

This electronic device here comprises an integrated structure, in particular a transistor TRN, for example an n-channel metal oxide semiconductor (NMOS) transistor.

The transistor TRN conventionally comprises a source semiconductive region S, a drain semiconductive region D and a gate region G. The active zone of the transistor TRN is here isolated from the other components of the integrated circuit by an isolating region RIS, for example of the shallow trench type.

The device DIS also comprises heating means electrically coupled here to two points ED1, ED2 of the source semiconductive region of the transistor TRN and configured to here cause a current I to circulate between the points ED1 and ED2.

More specifically, in this embodiment, the heating means comprise a current source SC connected on the one hand to the ground GND and on the other hand to the first point ED1 via, for example, an electrically conductive contact CT0, a metallization MTL1 situated at the first metallization level of the integrated circuit and a contact CT1 electrically coupled to the silicided zone (that is to say the zone comprising a metal silicide) of the source region S at the point ED1.

The heating means also comprise another contact CT2 electrically coupled at the point ED2 to the silicided zone of the source region S and linked to the ground GND via another metallization MTL2.

In order to increase the heating efficiency it is advantageously possible to arrange, between the points ED1 and ED2, a non-silicided zone, in order to increase the value of the resistance RS. In such a case, the silicided zones at ED1 and ED2 are separated from each other.

In this exemplary embodiment, the current source SC delivers a current I which circulates in the source semiconductive region RS between the two points ED1 and ED2 to exit again at the point ED2.

In the example described here, the two points ED1 and ED2 are situated respectively in the vicinity of two ends of the source semiconductive region and the straight line which links them extends substantially parallel to the width W of the channel of the transistor TRN.

In this FIG. 1, the reference RS represents the resistance of the source semiconductive region.

The circulation of the current I provokes, by Joule's effect, an increase in the temperature of the source region S and this heat is propagated according to the arrows F to all of the active zone of the transistor TRN via its channel region to reach, notably, the drain semiconductive region D.

Figure 2:
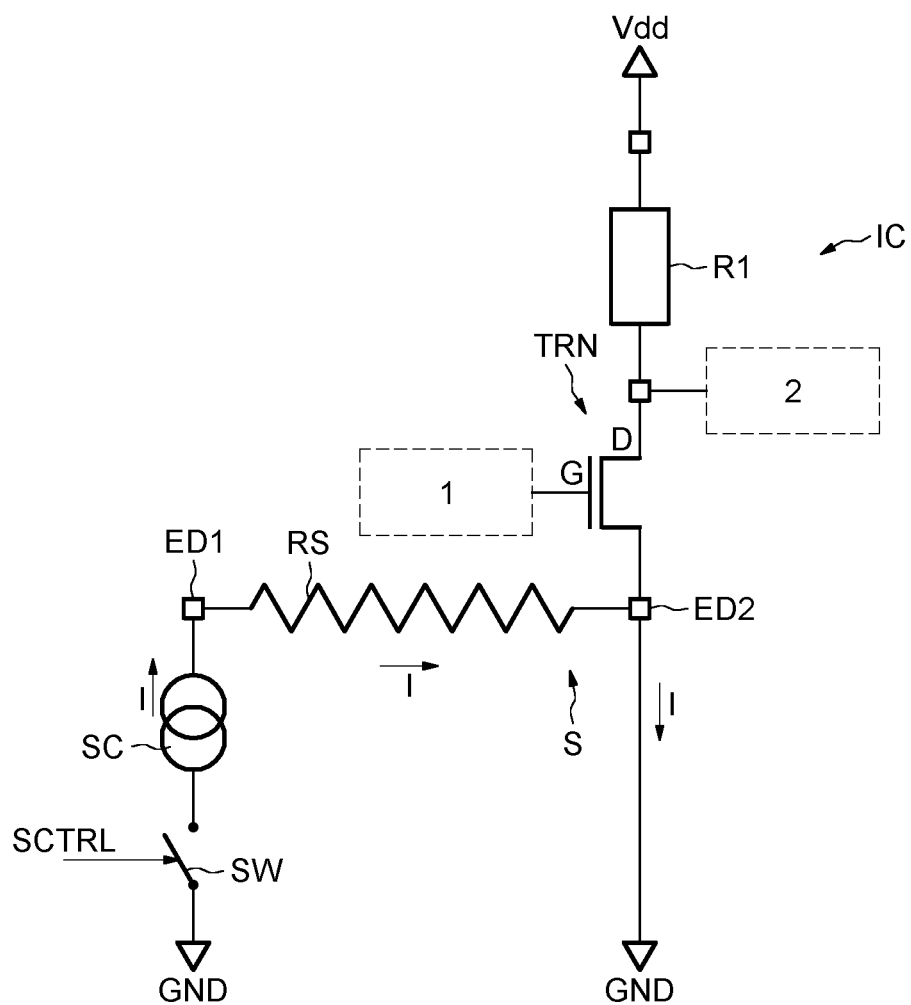

FIG. 2 shows an electrical circuit diagram corresponding to FIG. 1.

More specifically, FIG. 2 shows the source region S embodied by the resistor RS, the terminal ED2 of which is connected to the ground line GND and the terminal ED1 of which is connected to the ground line GND via the current source SC.

It will also be noted in this example that the current source SC can be activated via a switch SW controlled by a control signal SCTRL.

In other words, the current source can be activated or deactivated.

In this exemplary embodiment, the drain D of the transistor TRN is linked to the power supply voltage Vdd via a resistor R1 and the integrated circuit IC also comprises another part 1 connected to the gate G of the transistor and another part of circuit 2 connected to the drain of the transistor TRN.

It can therefore be seen here that the functionality of the integrated circuit IC and notably the functionality of the transistor TRN are in no way modified by the addition of the activatable current source SC.

The topology of the integrated circuit IC is simply only slightly modified by the addition of the current source SC internal to the integrated circuit IC.

Moreover, this is particularly simple to implement when the MOS transistor is an NMOS transistor since the source of an NMOS transistor is usually linked to the ground in normal operation.

The current source could also be external to the integrated circuit.

When the temperature of the active zone of the transistor TRN is to be increased, the switch SW is closed and the current source SC delivers the current I which circulates in the source semiconductive region S to be discharged to the ground GND.

After a heat-up time, which can be variable depending on the environment of the transistor, the current source SC is deactivated by opening the transistor SW. Then, the temperature of the active zone of the transistor is preferably left to become uniform before authorizing its normal operation within the integrated circuit IC.

It would be possible to authorize the operation of the transistor TRN simultaneously with the heating up thereof. However, in this case, this may lead to a degraded operation of the transistor TRN because of the presence of two different potentials at the two ends of the source region S. That said, such degraded operation may be acceptable in certain applications.

Although it is possible to cause a current I to circulate continuously in the source semiconductive region so as to increase the temperature of the active zone of the transistor, it has been observed that a more effective increase in the temperature was obtained by causing current pulses to circulate, preferably short pulses, for example of the order of a few microseconds, which makes it possible to limit the risk of the occurrence of the electro-migration phenomenon.

Figure 3:
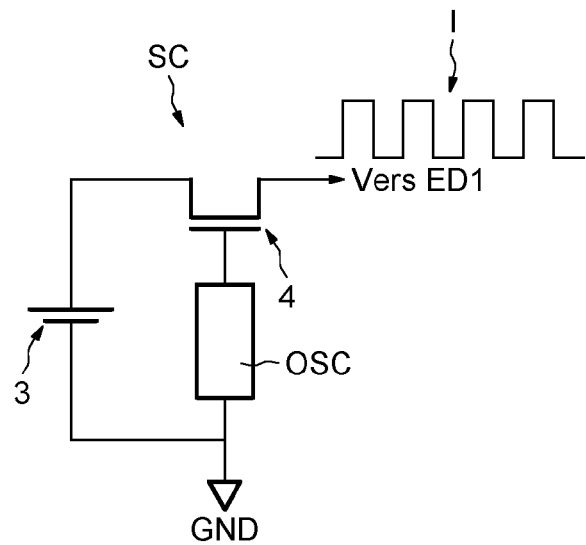

Also, it is possible to provide, as illustrated in FIG. 3, an exemplary current source SC delivering a pulse train of current I to ED1.

More specifically, in this exemplary embodiment, an MOS transistor 4 is controlled on its gate by an oscillator OSC so as to deliver, from a voltage generator 3, the current pulses I at the rate of the closure and opening of the transistor 4.

Figure 4:
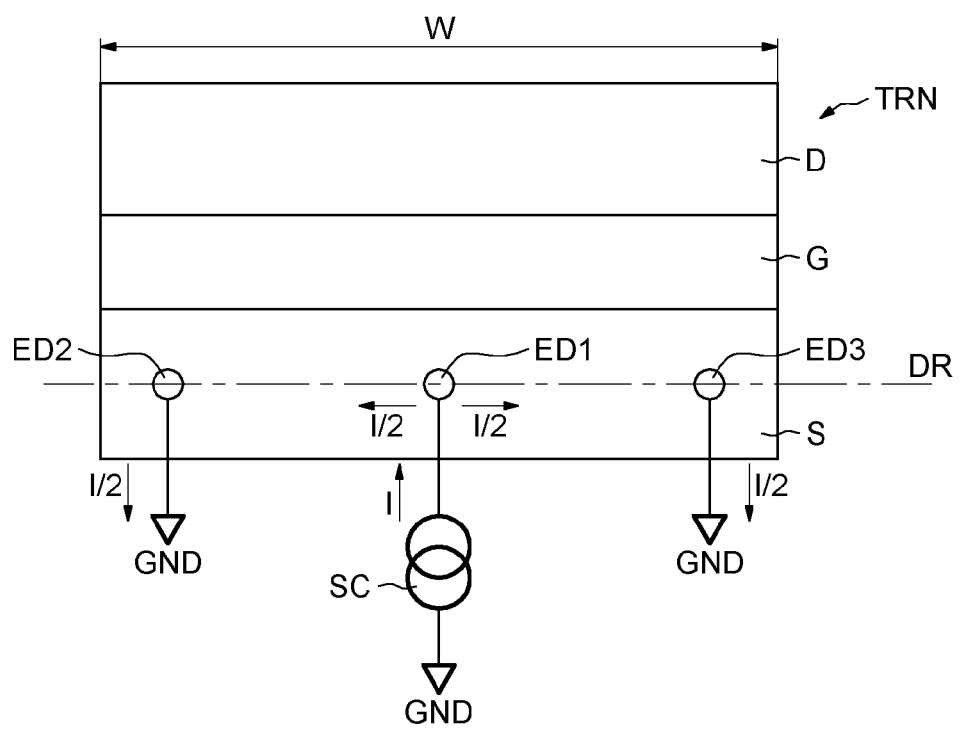

As a variant, as illustrated schematically in FIG. 4, it is possible to provide for the heating means to be coupled to the source semiconductive region, not at two points but at three points, ED1, ED2, ED3.

And, in this example, the first point ED1 is situated substantially equidistantly from the other two points ED2 and ED3 which are respectively situated at the two source semiconductive ends S.

The three points ED1, ED2, ED3 are here substantially aligned along a straight line DR which extends parallel to the width W of the channel of the transistor TRN.

The current source SC then injects the current I at the first point ED1 and the latter is then split into two substantially equal currents I/2 which are discharged respectively at the two end points ED2 and ED3 to the ground GND.

Such an embodiment also makes it possible to limit the risk of occurrence of the electro-migration phenomenon.

Figure 5:
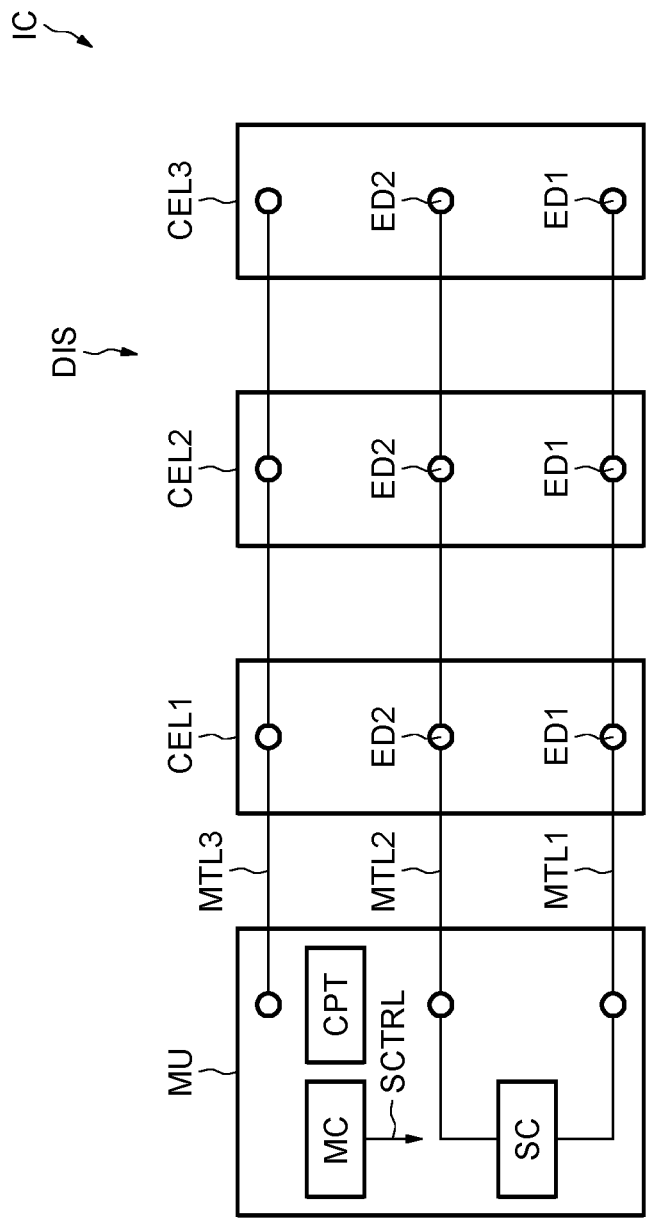

Obviously, it is possible, as illustrated in FIG. 5, to cause at least one current to circulate in a plurality of transistors of the integrated circuit IC.

In FIG. 5, the blocks CEL1 CEL2 CEL3 represent cells of the integrated circuit comprising a number of components of which at least one NMOS transistor must be heated up.

The device DIS also comprises, integrated in the integrated circuit IC, a temperature management unit MU comprising the current source SC, the control means MC delivering the control signal SCTRL and a temperature sensor CPT.

A first metallization MTL1 runs through the integrated circuit over the cells CEL1-CEL3 to be respectively coupled by corresponding contacts to the first point ED1 of the three NMOS transistors of the three cells CEL1-CEL3.

Similarly, a second metallization MTL2 circulates in the integrated circuit IC over the cells CEL1-CEL3 to be electrically coupled respectively to the three points ED2 of the source regions of these three transistors.

A third metallization MTL3 makes it possible to convey the power supply voltage Vdd for the integrated circuit IC in normal operation.

Thus, when the NMOS transistors of these cells CEL1-CEL3 are heated up, the cell SC delivers, over the metallization MTL1, a current I. The resulting currents are then injected at the points ED1 of the three NMOS transistors and exit again at the metallization MTL2.

It will be noted here that these metallizations contribute to the heating up of these transistors through the circulation of the currents within them.

The invention is not limited to the embodiments which have just been described but encompasses all the variants thereof.

Figure 6:
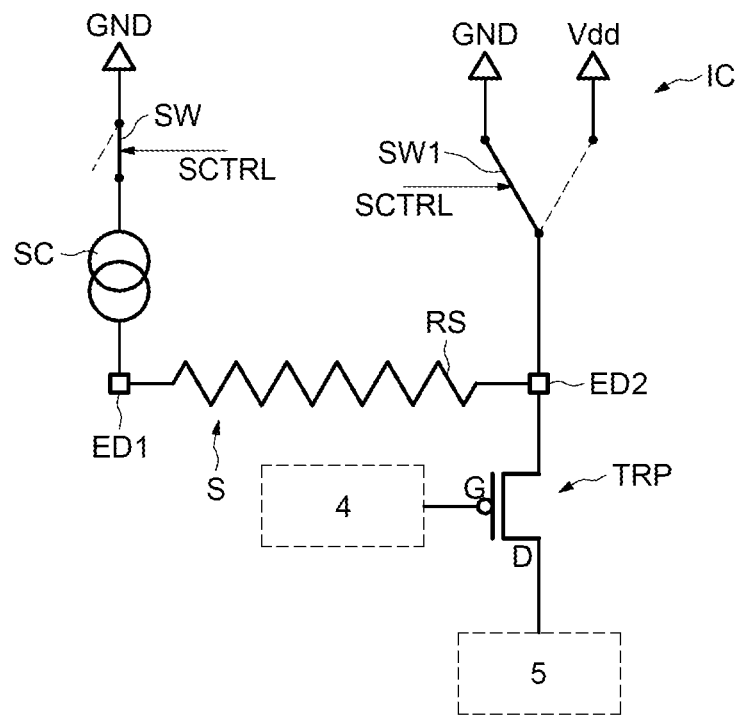

Thus, as illustrated in FIG. 6, it is also possible to heat up the source semiconductive region S of a p-channel metal oxide semiconductor (PMOS) transistor TRP.

More specifically, the current source SC is connected to the first point ED1 of the source region S via the switch SW controlled by the signal SCTRL and the second point ED2 of the source region is connected either to the ground GND or to the power supply voltage Vdd via another switch SW1 also controlled by the control signal SCTRL.

Other parts of the integrated circuit 4 and 5 are linked respectively to the gate G and to the drain D of the transistor TRP.

When the transistor TRP is to be heated up, the latter not being in normal operation, the signal SCTRL places the switch SW in its closed position and switches the switch SW1 such that the second point ED2 is linked to the ground GND.

In this case, a current I can circulate in the source semiconductive region by analogy to what has been described above.

Once the heating up is finished and the temperature has become uniform, it is then possible to place the transistor TRP in its normal operating mode by opening the switch SW and by switching the switch SW1 such that, this time, the second point ED2 is linked to the power supply voltage Vdd which is usually the case for a PMOS transistor.

As a variant, it would be possible to provide a setup symmetrical to that illustrated in FIG. 2 with the node ED2 of the source region of the PMOS transistor linked to the line intended to convey the voltage Vdd in normal operation. In this case, during the heating up with the transistor not in operation, this line would be linked to the ground GND.

Obviously, although the use of a current source SC has been described hereinabove, the use of a voltage generator which would apply a potential difference between the different points of the source, or drain, semiconductive region would also be possible to envisage.

It would also be possible to provide for the use of two current sources head to tail or else a two-directional current source or, by equivalence, one or more voltage generators, in the case where the aim is to cause two currents to circulate successively in opposite directions between the two points ED1 and ED2 so as to limit the risk of occurrence of the electro-migration phenomenon.

Although a heating up of the source region has been described hereinabove, it would also be possible to use the same means to perform the heating up of the drain region of the MOS transistor, whether it is an NMOS transistor or a PMOS transistor, at least to provide within the integrated circuit, if it does not already exist, a path to the ground for the discharging of the current circulating in the drain of the transistor during the heating up.

Although the embodiments described hereinabove have been focused on MOS transistors, it would be possible to apply this heating principle to any active zone of any integrated structure such as, for example, a bipolar transistor, a PN junction, a thyristor, etc.

Finally, the invention applies regardless of the type of substrate used for the integrated structure, whether it is for example a bulk substrate or a substrate of silicon on insulator (SOI) type and more particularly of fully depleted silicon on insulator (FDSOI) type.

The invention claimed is:

1. An electronic device, comprising:
    an integrated circuit comprising at least one MOS transistor, and
    a heating circuit electrically coupled to at least two points of at least one of a source semiconductive region or a drain semiconductive region of said at least one MOS transistor and configured to cause at least one current to circulate between said at least two points in that source or drain semiconductive region.

2. The device according to claim 1, wherein the at least one MOS transistor is an NMOS transistor.

3. The device according to claim 1, wherein said points are situated on a straight line extending substantially in a direction of a width of a channel of said at least one MOS transistor.

4. The device according to claim 1, wherein the at least two points are situated within the source semiconductive region.

5. The device according to claim 1, wherein the number of said points is equal to two, and the two points are respectively situated in the vicinity of two ends of the source or drain semiconductive region.

6. The device according to claim 1, wherein the number of said points is equal to three, a first point being bracketed by two second points, and the heating circuit configured to cause two currents to circulate between, respectively, the first point and the two second points.

7. The device according to claim 6, wherein the two second points are respectively situated in the vicinity of two ends of the source or drain semiconductive region and the first point is situated substantially equidistantly from the two second points.

8. The device according to claim 1, wherein the heating circuit comprises:
electrically conductive contacts respectively electrically coupled to said at least two points; and
at least one current source configured to inject at least one current at one of said at least two points via the corresponding contact, the resulting current or currents being discharged at another point or at the other points via the corresponding electrically conductive contact or contacts.

9. The device according to claim 8, in which the contact or contacts via which each current is discharged is or are linked to a ground line of the integrated circuit.

10. The device according to claim 1, wherein the heating circuit is configured to cause said at least one current to circulate in the form of at least one current pulse.

11. The device according to claim 1, wherein the heating circuit is controllable and the device further comprises a control circuit configured to activate the heating circuit when the at least one MOS transistor is not operating.

12. The device according to claim 1, wherein the heating circuit is configured to cause at least one current to circulate in, respectively, a plurality of MOS transistors via metallic lines extending over said plurality of MOS transistors.

13. The device according to claim 1, wherein the heating circuit is a component of the integrated circuit.

14. An electronic device, comprising:
a transistor having a source semiconductor region, a channel semiconductor region and a drain semiconductor region;
a first contact at a first point of said source semiconductor region;
a second contact at a second point of said source semiconductor region, wherein the first and second contacts are separate from each other and a portion of the source semiconductor region between the first and second contacts forms a first resistive circuit within the source semiconductor region;
a ground connection to the second contact; and
a current source connected between the first contact and the ground connection, said current source configured to circulate a current through said first resistive circuit such that the first resistive circuit within the source semiconductor region operates to heat up the source semiconductor region.

15. The device of claim 14, further comprising:
a third contact at a third point of said source semiconductor region, wherein the third contact is separate from the first and second contact and the source semiconductor region forms a second resistive circuit connected between the first and third contacts;
said current source further configured to circulate a current through said second resistive circuit to heat up the source semiconductor region.

16. The device of claim 14, wherein the transistor is an n-channel MOS transistor.

17. The device of claim 14, wherein the first and second contacts are silicide contacts at the source semiconductor region, said silicide contacts being separated from each other.

18. An electronic device, comprising:
a transistor having a source semiconductor region, a channel semiconductor region and a drain semiconductor region;
a first contact at a first point of said drain semiconductor region;
a second contact at a second point of said drain semiconductor region, wherein the first and second contacts are separate from each other and a portion of the drain semiconductor region between the first and second contacts forms a first resistive circuit within the drain semiconductor region connected between the first and second contacts;
a ground connection to the second contact; and
a current source connected between the first contact and the ground connection, said current source configured to circulate a current through said first resistive circuit such that the first resistive circuit within the drain semiconductor region operates to heat up the drain semiconductor region.

19. The device of claim 18, further comprising:
a third contact at a third point of said drain semiconductor region, wherein the third contact is separate from the first and second contact and the drain semiconductor region forms a second resistive circuit connected between the first and third contacts;
said current source further configured to circulate a current through said second resistive circuit to heat up the drain semiconductor region.

20. An electronic device, comprising:
a transistor having a source region, a channel region and a drain region;
a first contact at a first point of said drain region;
a second contact at a second point of said drain region, wherein the first and second contacts are separate from each other and the drain region forms a first resistive circuit connected between the first and second contacts;
a ground connection to the second contact;
a current source connected between the first contact and the ground connection, said current source configured to circulate a current through said first resistive circuit to heat up the drain region; and
a switch circuit configured to selectively connect said second contact to the ground connection in one mode and alternatively connect said second contact to a power supply node in another mode.

21. The device of claim 18, wherein the transistor is a p-channel MOS transistor.

22. The device of claim 18, wherein the first and second contacts are silicide contacts at the drain region, said silicide contacts being separated from each other.

23. An electronic device, comprising:
a transistor having a source region, a channel region and a drain region;
a first contact at a first point of said source region;
a second contact at a second point of said source region, wherein the first and second contacts are separate from each other and the source region forms a first resistive circuit connected between the first and second contacts;
a ground connection to the second contact;

a current source connected between the first contact and the ground connection, said current source configured to circulate a current through said first resistive circuit to heat up the source region; and a switch circuit configured to selectively connect said second contact to the ground connection in one mode and alternatively connect said second contact to a power supply node in another mode.

\* \* \* \* \*

UNITED STATES PATENT AND TRADEMARK OFFICE
CERTIFICATE OF CORRECTION

PATENT NO. : 9,746,863 B2
APPLICATION NO. : 14/960052
DATED : August 29, 2017
INVENTOR(S) : Philippe Galy et al.

It is certified that error appears in the above-identified patent and that said Letters Patent is hereby corrected as shown below:

In the Claims

At Column 8, Claim number 18, Line numbers 19-20, please delete the phrase "connected between the first and second contacts".

Signed and Sealed this
Twenty-fourth Day of October, 2017

Joseph Matal
*Performing the Functions and Duties of the*
*Under Secretary of Commerce for Intellectual Property and*
*Director of the United States Patent and Trademark Office*